(12) United States Patent  
Koo et al.

(10) Patent No.: US 7,994,071 B2  
(45) Date of Patent: Aug. 9, 2011

(54) COMPOSITIONS FOR FORMING ORGANIC INSULATING FILMS, METHODS FOR FORMING ORGANIC INSULATING FILMS USING THE COMPOSITIONS AND ORGANIC THIN FILM TRANSISTORS COMPRISING AN ORGANIC INSULATING FILM FORMED BY SUCH A METHOD

(75) Inventors: Bon Won Koo, Suwon-si (KR); Sang Yoon Lee, Seoul (KR); Jung Seok Hahn, Senongnam-si (KR); Joo Young Kim, Suwon-si (KR)

(73) Assignee: Samsung Electronics Co., Ltd., Gyeonggi-do (KR)

( * ) Notice: Subject to any disclaimer, the term of this patent is extended or adjusted under 35 U.S.C. 154(b) by 1105 days.

(21) Appl. No.: 11/633,008

(22) Filed: Dec. 4, 2006

(65) Prior Publication Data  
US 2007/0259476 A1 Nov. 8, 2007

(30) Foreign Application Priority Data

May 4, 2006 (KR) .................. 10-2006-0040429

(51) Int. Cl.  
*H01L 21/31* (2006.01)  
*H01L 21/469* (2006.01)  
(52) U.S. Cl. .................. 438/780; 257/E21.492; 438/82; 438/99; 438/778; 438/783  
(58) Field of Classification Search .................. 549/59; 438/99, 82, 778, 780, 783; 257/40, E21.492  
See application file for complete search history.

(56) References Cited

U.S. PATENT DOCUMENTS

| | | | |
|---|---|---|---|
| 6,232,157 B1 | 5/2001 | Dodabalapur et al. | |
| 6,635,508 B2 * | 10/2003 | Arai et al. | 438/99 |
| 6,821,811 B2 * | 11/2004 | Hirakata et al. | 438/82 |
| 6,949,762 B2 * | 9/2005 | Ong et al. | 257/40 |

(Continued)

FOREIGN PATENT DOCUMENTS

JP 2002080547 * 3/2002

(Continued)

OTHER PUBLICATIONS

Marcus Halik et al. "High-Mobility Organic Thin-Film Transistors Based on α,α'-didecyloligothiophenes". Journal of Applied Physics, vol. 93, No. 5, Mar. 1, 2003, pp. 2977-2981.

(Continued)

*Primary Examiner* — Asok K Sarkar  
(74) *Attorney, Agent, or Firm* — Harness, Dickey & Pierce, P.L.C.

(57) ABSTRACT

Disclosed are compositions for forming organic insulating films and methods for forming organic insulating films using one or more of the compositions. The compositions include at least one ultraviolet (UV) curing agent, at least one water-soluble polymer and at least one water-soluble fluorine compound, and the method includes applying the composition to a substrate to form a coating layer, irradiating the coating layer with UV light to form an exposed layer and developing the exposed layer with an aqueous developing solution to obtain an organic insulating film and/or pattern. Also disclosed are organic thin film transistors comprising an organic insulating film formed by one of the methods using one of the compositions that may exhibit improved hysteresis performance and/or acceptable surface properties without the need for additional processing, thereby simplifying the fabrication process.

18 Claims, 3 Drawing Sheets

U.S. PATENT DOCUMENTS

| | | | |
|---|---|---|---|
| 7,462,726 B2* | 12/2008 | Nakamura | 549/59 |
| 2003/0096195 A1* | 5/2003 | Rolfson | 430/311 |
| 2004/0054044 A1* | 3/2004 | Bittner et al. | 524/261 |
| 2004/0185372 A1* | 9/2004 | Takakuwa | 430/270.1 |
| 2004/0247814 A1* | 12/2004 | Sirringhaus et al. | 428/64.1 |
| 2005/0127355 A1* | 6/2005 | Jeong et al. | 257/40 |
| 2005/0153239 A1* | 7/2005 | Hoshi et al. | 430/270.1 |
| 2006/0006380 A1* | 1/2006 | Shin et al. | 257/40 |
| 2006/0131267 A1* | 6/2006 | Lee et al. | 216/41 |
| 2007/0184366 A1* | 8/2007 | Takakuwa | 430/7 |

FOREIGN PATENT DOCUMENTS

| | | |
|---|---|---|
| KR | 10-2004-0028010 | 4/2004 |
| WO | 01/46987 | 6/2001 |

OTHER PUBLICATIONS

Fang-Chung Chen et al. "Organic Thin-Film Transistors with Nanocomposite Dielelectric Gate Insulator". Applied Physics Letters, vol. 85, No. 15, Oct. 11, 2004, pp. 3295-3297.

* cited by examiner

FIG. 1

(CONVENTIONAL ART)

COMPOSITIONS FOR FORMING ORGANIC INSULATING FILMS, METHODS FOR FORMING ORGANIC INSULATING FILMS USING THE COMPOSITIONS AND ORGANIC THIN FILM TRANSISTORS COMPRISING AN ORGANIC INSULATING FILM FORMED BY SUCH A METHOD

PRIORITY STATEMENT

This non-provisional application claims priority under 35 U.S.C. §119(a) on Korean Patent Application No. 2006-40429 filed on May 4, 2006, which is herein incorporated, in its entirety, by reference.

BACKGROUND OF EXAMPLE EMBODIMENTS

1. Field of Endeavor

Example embodiments provide compositions suitable for forming organic insulating films, methods for forming organic insulating films using such compositions, and organic thin film transistors comprising an organic insulating film formed by one of the methods. More specifically, example embodiments provide compositions for forming an organic insulating film which comprise an ultraviolet (UV) curing agent, a water-soluble polymer and a water-soluble fluorine compound; methods for forming organic insulating films using the composition in which an organic insulating film can be patterned without the need for an etching process using a photoresist. The use of compositions and methods as disclosed herein are capable of producing insulating films and corresponding structures whereby properties, for example, the hysteresis, of the organic insulating film can be improved. The use of compositions and methods as disclosed herein are capable of producing organic thin film transistors that incorporate one or more insulating films manufactured according to one or more methods as disclosed herein and which may exhibit improved yield, performance and/or reliability attributable to the inclusion of the improved organic insulating film.

2. Description of the Related Art

In recent years, a variety of polymeric materials have been investigated for their potential as electrical and electronic materials suitable for a wide variety of applications, e.g., functional electronic and optical devices as insulator and/or semiconductor materials. Polymeric materials may provide one or more advantages over previous materials including, for example, the relative ease with which they can be molded into fibers and films, improved flexibility, increased conductivity and reduced production costs. Research relating to electrically conductive polymers and their use in fabricating semiconductor active regions for organic thin film transistors has been ongoing for at least about 25 years.

Organic thin film transistors can be fabricated using relatively simple processes, such as printing, at relatively low cost. In addition, advantages associated with organic thin film transistors include relatively simple processes and their generally good compatibility with flexible substrates. In light of these advantages, a number of studies on organic thin film transistors are now ongoing around the world. Indeed, it is anticipated that organic thin film transistors will be particularly useful in fabricating driving devices for active displays and in fabricating plastic chips that may, in turn, be incorporated into smart cards and/or inventory tags, for example RFID products.

The formation of organic insulating films in the fabrication of organic electronic devices, for example, display devices (e.g., electroluminescence (EL) devices and light-emitting diodes (LEDs)) is one of the most promising applications of these technologies. Although various methods using, for example, polyimides, benzocyclobutene (BCB), photoacryl, and other suitable materials for fabricating organic insulating films have been disclosed, the performance of such organic insulating materials have been generally considered less satisfactory than conventional inorganic insulating materials and have not, therefore, been widely adopted as replacements for inorganic insulating films in semiconductor device fabrication.

Several attempts have been made to address the noted deficiencies of the organic insulating materials shortcomings. One approach suggests that the performance of the organic insulating materials can be improved for use in organic thin film transistors by utilizing an insulating polymer having a maleic imide copolymer structure. Despite some improvement, however, the copolymer structure is still soluble in organic solvents and will, as a result, tend to suffer some degree of degradation as a result of exposure to such solvents during subsequent photolithographic processing.

Other attempts have been made to improve the chemical resistance of the organic insulating film(s) during subsequent processing with organic solvents by mixing polyvinylphenol (PVP) with polymelamine-co-formaldehyde. These materials, however, are not generally suitable for use with plastic substrates because thermal processing necessary to achieve the desired cross-linking of the PVP requires heating to temperatures on the order of 200° C., temperatures that will tend to degrade or compromise certain desirable substrates.

Figure 1:
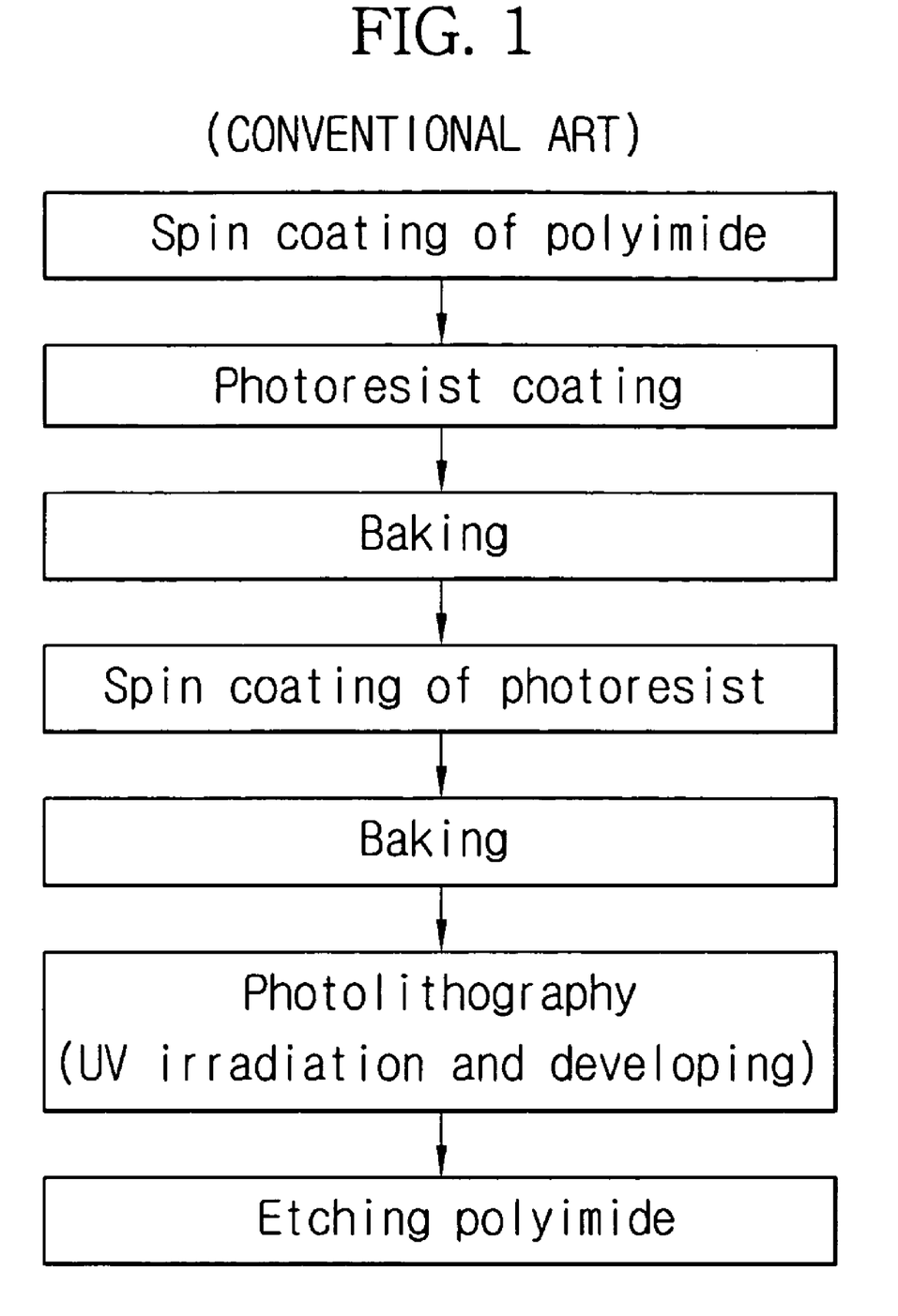
FIG. 1 is a chart illustrating a conventional method for forming an organic insulating film.

In particular, patterning of organic insulating films for insulating adjacent electrodes and/or defining various regions is typically required during the fabrication of organic thin film transistors that may be used in, for example, display devices. One patterning method includes forming an organic insulating film by spin coating a polyimide layer, coating the polyimide with a photoresist layer, baking and exposing the photoresist layer using a conventional UV photolithographic process, developing the exposed photoresist layer, and etching the polyimide using the photoresist pattern as an etch mask as illustrated, for example, in FIG. 1. The organic insulating film may also be subjected to one or more surface treatments.

However, because this method employs a photolithographic process, the underlying organic insulating film must exhibit both superior thermal, developer and etch resistance relative to the overlying photoresist pattern in order to avoid being degraded during being degraded by the heating, developing and etching processes associated with photolithographic pattern formation. In addition, the organic insulating film should exhibit sufficient chemical resistance to endure the photoresist stripping process(es) used to remove the overlying photoresist after the etch has been completed.

SUMMARY OF EXAMPLE EMBODIMENTS

Example embodiments include compositions for forming organic insulating films which comprise an UV curing agent, a water-soluble polymer and a water-soluble fluorine compound that can exhibit improved electrical properties. Other example embodiments include methods for forming organic insulating films using one or more compositions whereby an organic insulating film pattern can be formed without utilizing a conventional photoresist patterning and etching process, thereby allowing for improved electrical properties, for example, hysteresis, in the resulting organic insulating film pattern.

Other example embodiments include methods of fabricating organic thin film transistors that incorporate an organic insulating film that may be formed using a method according to another example embodiment and/or that utilizes a composition according to another example embodiment. Other example embodiments include display drivers and display devices comprising an organic thin film transistor fabricated using a method according to an example embodiment and/or incorporating an organic thin film transistor according to an example embodiment fabricated using a composition according to an example embodiment in forming the organic insulating film.

The incorporation of one or more water-soluble fluorine compounds in the example embodiments of the compositions tend to alter the relative hydrophilicity of a channel relative to an adjacent organic insulating film pattern resulting in an increase in the contact angle θ. The use of one or more water-soluble fluorine compounds in the example embodiments of the compositions provides improved control over the relative hydrophilicity of channel regions and adjacent organic insulating film patterns. In example embodiments, the composition of fluorine compounds may be changed according to the used semiconductor but the basis can be evaluated by the contact angle. In example embodiments, a value over 70° may be achieved.

The water-soluble fluorine compound(s) will typically be selected from a group consisting of fluoroalkanes and their derivatives, perfluoroalkylalcohol ethylene oxides and their derivatives, perfluoroalkylcarboxylic acids and their salts, perfluoroalkylsulfonic acids and their salts, perfluoroalkyloxybenzenesulfonic acids and their salts, perfluoroalkylbenzenesulfonic acids and their salts, perfluoroalkyl amine and their salts, perfluoroalkylsulfonamides and their salts, ammonium fluoride, monoethanolamine fluoride, and tetramethylammonium fluoride. The water-soluble fluorine compound(s) may be incorporated in the composition in a ratio relative to the UV curing agent and the water-soluble polymer in the range of 1:10 to 1:1, based on the solids content.

The water-soluble polymers utilized in the compositions will include at least one functional group exhibiting an affinity for water, for example, —OH, —COOH, —NH$_2$ or —CONH$_2$, within the molecular structure, in a quantity sufficient whereby the polymer(s) dissolve readily in water and will tend to exhibit little, if any, crosslinking. The example embodiments of the compositions will also tend to reduce the degradation in the performance of organic electronic devices which may result from, for example, deterioration of pixel regions of adjacent organic electronic devices. Such degradation has, for example, been associated with conventional processes in which a photoresist and an organic solvent are used in the process of forming an organic insulating film pattern.

Water-soluble polymer that may be used in the example embodiment compositions include, for example, polyvinyl alcohol, polyvinyl chloride, polyacryl amide, polyethylene glycol, polyethylene oxide, polymethyl vinyl ether, polyethylene imine, polyphenylene vinylene, polyaniline, polypyrrole, mixtures, combinations, copolymers, terpolymers and higher order polymers thereof. The water-soluble polymer(s) may also be combined in copolymers, terpolymers or higher order polymers (collectively referred to as copolymers for convenience) with one or more polymers that are less soluble or insoluble in water and mixtures thereof. Such copolymers will include a sufficient portion of the water-soluble polymers, for example, 10 to 99% of the total polymer by weight, whereby the copolymer exhibits sufficient solubility in water.

The UV curing agent(s) that may be used in example embodiments of the composition facilitate curing of the organic insulating films by UV irradiation. Examples of such UV curing agents include, for example, ammonium dichromate, pentaerythritol triacrylate, urethane acrylate, and mixtures thereof. The UV curing agent(s) may be added to an aqueous solution of the water-soluble polymer(s) in, for example, deionized water with the amount of the UV curing agent being sufficient to achieve a curing agent:polymer ratio of, for example, 1:100 to 1:20, and perhaps more typically, from 1:50 to 25:1, based on the respective solids content.

Example embodiments of the methods for forming such organic insulating films may include coating a substrate with the composition to form a coating layer; and irradiating portions of the coating layer with UV light of sufficient intensity and duration to form an exposed layer, and developing the exposed layer to remove portions of the exposed layer than thereby form an organic insulating pattern.

BRIEF DESCRIPTION OF THE DRAWINGS

The constituents, elements, features and practices relating to example embodiments will be more clearly understood by considering the following detailed description in conjunction with the accompanying drawings, in which.

It should be noted that these Figures are intended to illustrate the general characteristics of methods, structure and/or materials utilized in certain example embodiments and to supplement the written description provided below. These drawings are not, however, to scale and may not precisely reflect the precise structural characteristics of any given embodiment, and should not be interpreted as defining or limiting the range of values or properties encompassed by example embodiments. In particular, the relative thicknesses and positioning of layers, regions and/or structural elements may be reduced or exaggerated for clarity. The use of similar or identical reference numbers in the various drawings is intended to indicate the presence of a similar or identical element or feature.

DESCRIPTION OF EXAMPLE EMBODIMENTS

Figure 2:
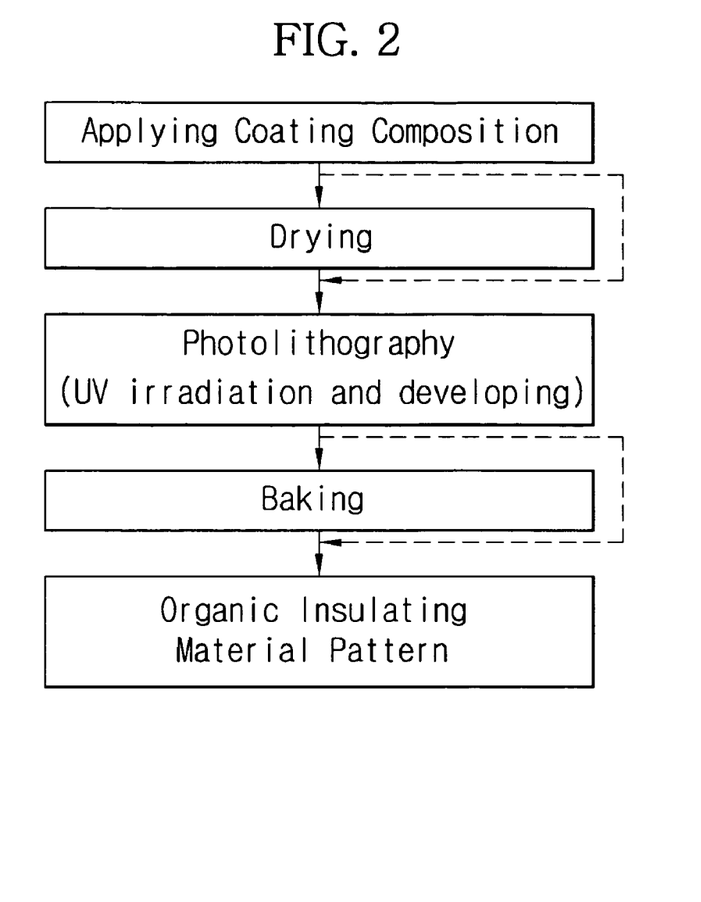
FIG. 2 is a chart illustrating a method for forming an organic insulating film according to example embodiments.

Example embodiments will now be described in detail with reference to the accompanying drawings. FIG. 2 is a chart schematically illustrating a method for forming an organic insulating film according to one example embodiment. As illustrated in FIG. 2, the water-soluble polymer solution may be applied to a substrate as a coating composition using any appropriate process(es) including, for example, spin coating, dip coating, printing, ink-jet printing, or roll coating, sufficient to produce a coating layer of acceptable thickness and uniformity.

As illustrated in FIG. 2, after application, the coating layer may be baked at a temperature and for a time period sufficient to remove a portion of the water and thereby provide a coating layer that exhibits satisfactory dimensional stability. The drying may be performed using one or more conventional processes that are well known to those skilled in the art.

The exposure of the coating layer to UV irradiation may be performed using a lamp having a power of, for example, 300 to 500 W, an emitting UV radiation at a wavelength of, for example, 340 to 400 nm, whereby a satisfactory degree of exposure may be achieved using an exposure period of 10 to 180 seconds to obtain an exposed layer. The exposed layer may then be developed using deionized water at, for example, room temperature (about 25° C.) for a development period of, for example, 1 to 5 minutes, sufficient to remove portions of the exposed layer to define a pattern of residual material from the coating layer.

Example embodiments of methods of fabricating such patterns may also include additional thermal processing, for example, baking, after the pattern has been developed to remove residual water and/or improve the resistance of the pattern to subsequent processing. One such thermal process includes baking the patterned substrate on a hot plate maintained at a temperature of, for example, 50 to 200° C., for a period of, for example, 0.5 to 2 hours. As will be appreciated by those skilled in the art, the combination of bake temperature and time necessary to achieve the desired changes in the pattern will may be modified or adjusted depending on the composition of the coating layer. Example embodiments of the compositions may be used to produce patterns having appropriate surface properties, e.g., contact angle, without the need to utilize additional post-patterning surface treatments, thereby simplifying the processing.

Example embodiments also include organic thin film transistors comprising a substrate, a gate electrode, an organic insulating film, source/drain electrodes and an organic semiconductor layer wherein the organic insulating film is formed utilizing a method within the scope of example embodiments discussed herein. As will be appreciated by those skilled in the art, there is no particular restriction as to the structure of the organic thin film transistors which may, for example, be classified as bottom contact type, top contact type, and top gate type structures depending on the particular configuration utilized. For the purposes of discussion and as reflected in the associated figures, the following discussion will be generally directed to bottom contact type and top gate type organic thin film transistors.

Figure 3:
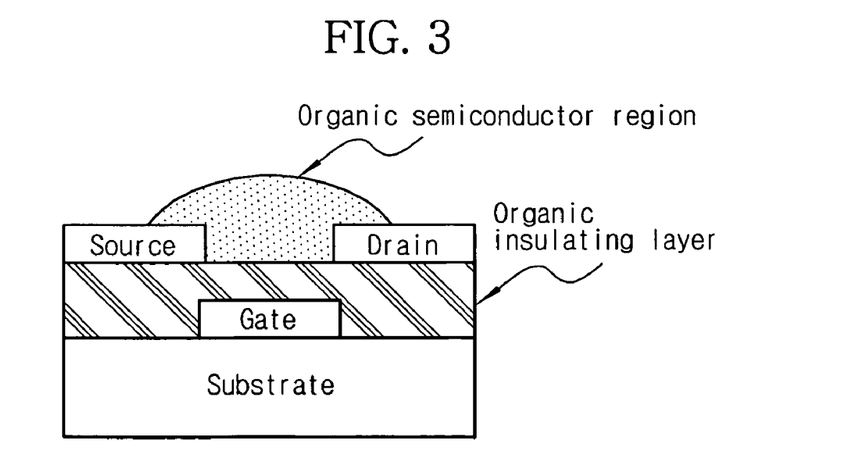
FIG. 3 is a cross-sectional view of an organic thin film transistor comprising an organic insulating film formed by a method and utilizing a composition according to example embodiments.

FIG. 3 illustrates an example embodiment of a bottom contact type organic thin film transistor comprising a substrate, a gate electrode formed on a surface of the substrate, an organic insulating film formed on the gate electrode, source/drain electrodes formed on the organic insulating film, and an organic semiconductor layer formed on the source/drain electrodes and a portion of the organic insulating film exposed between the electrodes. As will be appreciated by those skilled in the art, the basic elements of the bottom contact type organic thin film transistor may be reconfigured to produce alternative structures, for example, a top gate type organic thin film transistor (not shown), comprising a substrate, source/drain electrodes formed on the surface of the substrate, an organic semiconductor layer formed on the source/drain electrodes and on the surface of the substrate between the electrodes, an organic insulating film formed on the organic semiconductor layer, and a gate electrode formed on the organic semiconductor layer.

Figure 4:
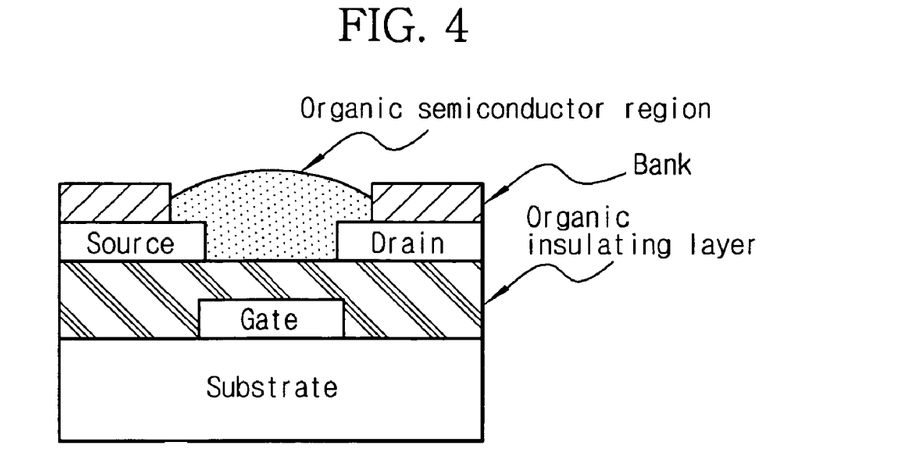
FIG. 4 is a cross-sectional view of an organic thin film transistor comprising banks and an organic insulating film formed by a method and utilizing a composition according to example embodiments.

As shown in FIG. 4, example embodiments of the organic thin film transistor may also retaining structures or banks formed on source/drain electrodes. As used herein, the term "banks" refers to "partition members" that may be used to divide and separate adjacent pixel regions and thereby suppress and/or prevent cross-talk between devices and/or to define substrate regions so that tend to retain ink or other materials applied to the substrate regions and thereby reduce and/or prevent contamination of adjacent regions by tending to maintain the ink or other materials within the desired zones.

The banks may be formed using conventional methods that will be well known to those skilled in the art. According to example embodiments, the banks may be formed using an aqueous solution of water-soluble polymer(s), a UV curing agent and a water-soluble fluorine compound, thereby forming banks from material(s) that will exhibit the desired surface properties without requiring subsequent surface treatment processing, thereby simplifying the fabrication. Those skilled in the art will also appreciate that forming banks according to one ore more example embodiment methods may simplify processing and/or improve product performance, the process is not so limited and may incorporate banks formed using conventional methods and may be subjected to surface treatments in order to obtain the desired surface properties.

The organic semiconductor layer may be selected from a group of materials consisting of polythiophene, polyaniline, polyacetylene, polypyrrole, polyphenylene vinylene, mixtures and derivatives thereof, but is not limited thereto. Materials for the gate electrode, the source electrode and the drain electrode may be selected from a group of conductors consisting of gold (Au), silver (Ag), aluminum (Al), nickel (Ni), molybdenum (Mo), tungsten (W), indium-tin oxide (ITO), indium-zinc oxide (IZO), polythiophene, polyaniline, polyacetylene, polypyrrole, polyphenylene vinylene, and polyethylenedioxythiophene (PEDOT)/polystyrenesulfonate (PSS) mixtures, derivatives, mixtures, alloys and combinations thereof, but are not limited thereto. The substrate may be selected from a group consisting of glass, insulators, semiconductors, plastics and combinations thereof, but is not limited thereto and will generally be selected to provide properties suitable for both the processing and the anticipated use of the final product.

Example embodiments of the bottom contact type organic thin film transistors may be fabricated by a method that includes forming a gate electrode on a substrate; forming an organic insulating film on the gate electrode; forming source/drain electrodes on the organic insulating film; and forming an organic semiconductor layer on the exposed surfaces of the organic insulating film and the source/drain electrodes. Conversely, example embodiments of the top gate type organic thin film transistors may be fabricated using a method including forming source/drain electrodes on a substrate; forming an organic semiconductor layer on the substrate extending between the source/drain electrodes; forming an organic insulating film on the organic semiconductor layer; and forming a gate electrode on the organic insulating film. Other example embodiments of these methods may include forming banks on the source/drain electrodes before forming the organic semiconductor layer during fabrication of the bottom contact type organic thin film transistors or forming banks on the source/drain electrodes before depositing the organic semiconductor material during the fabrication of the top gate type organic thin film transistors.

Each of the noted processes utilized in fabricating example embodiments of the bottom contact type organic thin film transistors is discussed further below. As will be appreciated by those skilled in the art, the following comments are equally applicable to methods used in fabricating the bottom contact type organic thin film transistors as well although the order in which the processes are performed will vary accordingly.

Formation of Gate Electrode

The substrate is washed or otherwise prepared in a manner sufficient to remove impurities and contamination present thereon using any suitable or conventional method of substrate preparation. A single or multi-layer gate electrode film may then be formed on the surface of the substrate and then patterned and etched to obtain a gate electrode pattern.

Formation of Organic Insulating Film

A gate insulating film of sufficient thickness, uniformity and dielectric strength is then formed on the gate electrode and the exposed regions of the substrate using any suitable or conventional process. As will be appreciated by those skilled in the art, a variety of processes may be utilized for forming the gate insulating film including, for example, vacuum evaporation and solution deposition. Depending on the materials and processes utilized, the gate insulating film may also be subjected to one or more thermal processes or "bakes" that may include, for example, a soft bake and/or a hard bake.

Formation of Source/Drain Electrodes

Source/drain electrodes may then be formed on the gate insulating layer. Specifically, one or more layers of a suitable conductor, for example a metal, metal nitride, metal oxide, metal alloy, organic conductor or combination thereof is deposited on the gate insulating film using any suitable or conventional thin film formation technique(s). This conductive thin film may then be patterned using any suitable or conventional photolithographic process with the exposed photoresist then being developed to protect those areas of the conductive film that are to become source and drain electrodes are formed and expose those regions of the film that will be removed to form the S/D pattern. The conductive thin film is then etched using the S/D photoresist pattern as an etch mask using an etching technique suitable for the conductive material(s) present in the conductive thin film. After completing the etch process(es), the photoresist pattern may be removed using a conventional photoresist stripping method to expose the source/drain electrodes on the gate insulating film.

Processes for the formation of the source and drain electrodes on the gate insulating film are not especially limited and may, for examples, utilize one or more methods selected from a group including vacuum evaporation, thermal evaporation, spin coating, roll coating, spray coating and printing.

Formation of Organic Semiconductor Layer

An organic semiconductor layer is formed by applying one or more suitable organic semiconductor material(s) to the source/drain electrodes and the gate insulating film using any suitable or conventional coating process. Coating processes generally considered suitable for depositing such organic semiconductor material include, but are not limited to, thermal evaporation, screen printing, printing, spin coating, dip coating, and ink spraying.

Example embodiments also provide for the fabrication of display devices incorporating such organic thin film transistors. A variety of display devices may be manufactured in this manner including, for example, electroluminescence devices, liquid crystal devices and/or electrophoresis devices. Example embodiments also provide for electronic devices incorporating one or more devices including such organic thin film transistors, for example, display drivers, displays, smart cards and inventory (RFID) tags.

Certain example embodiments are be explained in greater detail below with reference to the following examples. However, as will be appreciated by those skilled in the art, these examples are given for the purpose of illustration only and are not intended to, and should not be construed to, limit the scope of the appended claims.

EXAMPLES

Example 1

Formation of Pattern of Organic Insulating Film

The coating composition was prepared by adding ammonium dichromate (Sigma Aldrich) to a 5 wt % solution of polyvinyl alcohol (#2000, Kanto Chemical Co.) in deionized water to prepare an intermediate solution. (Unless otherwise indicated, all weight percent (wt %) values are based on a "dry" weight) The ammonium dichromate was added to the polyvinyl alcohol at a ratio of 1:33, based on the solids content. A fluoroalkane (Zonyl DuPont®), specifically a fluorine compound that is stable in aqueous solutions was then added to the intermediate solution to produce an example coating composition. The ratio of the fluoroalkane to the water-soluble polymer in the coating composition was 0.3:1, based on the solids content. The resulting example coating composition, an aqueous polyvinyl alcohol solution, was then spin-coated on the substrate and the electrode pattern and dried to remove the majority of the solvent (water) and thereby form a coating layer.

The surface of those portions of the coating layer that will become banks was then irradiated using a UV lamp with a power of about 400 W/cm$^2$ at a wavelength of 370 nm for an exposure time of 180 seconds. The exposed coating layer, including the irradiated bank portions, was then developed using deionized water at room temperature for a development period of 3 minutes to obtain a developed coating layer. The developed coating layer was then baked on a hot plate at a bake temperature of 200° C. for a bake time of one hour to form an organic insulating film.

Example 2

Fabrication of Organic Thin Film Transistor

A glass substrate was cleaned, and aluminum (Al) was deposited thereon using a sputtering technique to form a gate electrode having a thickness of about 1,500 Å, and suitable for subsequently forming an electrical connection to a driving circuit. An organic insulating film was formed on the gate electrode in accordance with the compositions and methods outlined above in Example 1. A layer of gold (Au) was then deposited on the insulating film to a thickness of 700 Å using a thermal evaporation method. This composite conductive layer was then subjected to a photolithographic process to form an appropriate etch mask and then etched to produce an electrode pattern.

Thereafter, polythiophene was applied to the Au electrodes as an organic semiconductor material and the organic insulating film by ink spraying to form a semiconductor active layer, completing fabrication of an organic thin film transistor.

Examples 3

Fabrication of Organic Thin Film Transistor Comprising Banks

An organic thin film transistor was fabricated in the same manner as in Example 2, except that banks were formed on the Au electrodes before formation of the organic semiconductor layer. The banks were formed by the following procedure.

First, ammonium dichromate (Sigma Aldrich) was added to a 5 wt % solution of polyvinyl alcohol (#2000, Kanto Chemical Co.) in deionized water. At this time, the ratio of the ammonium dichromate to the polyvinyl alcohol was 1:33, based on the solids content. A quantity of one or more fluoroalkanes (for example, one of DuPont's Zonyl® surfactants) capable of forming stabile fluorine compound(s) in water was then added to the solution to establish a weight ratio of 1:33 between the fluoroalkane(s) and the water-soluble polymer(s), based on the solids content. The resulting polyvinyl alcohol solution was then applied to the Au electrodes previously formed on the substrate, and dried using conventional methods to form a dried coating layer.

Regions of the dried coating layer were then irradiated using a UV lamp with a power 400 W/cm$^2$ at a wavelength of 370 nm for a period of 180 seconds to produce an exposed coating layer. The exposed coating layer was then developed by exposing the surface to deionized water or a suitable aqueous solution at a temperature and for a period sufficient to remove the unexposed portions of the dried coating layer, in this instance room temperature (25° C.) for 3 minutes, and obtain the desired bank pattern. The substrate with its bank pattern was then baked on a hot plate at 200° C. for one hour to fix the bank pattern and improve its resistance to subsequent processing.

Experimental Example 1

The current transfer characteristics of the organic thin film transistor fabricated in Example 2 were evaluated using a KEITHLEY Semiconductor Analyzer (4200-SCS). The results are shown in FIG. 5.

Figure 5:
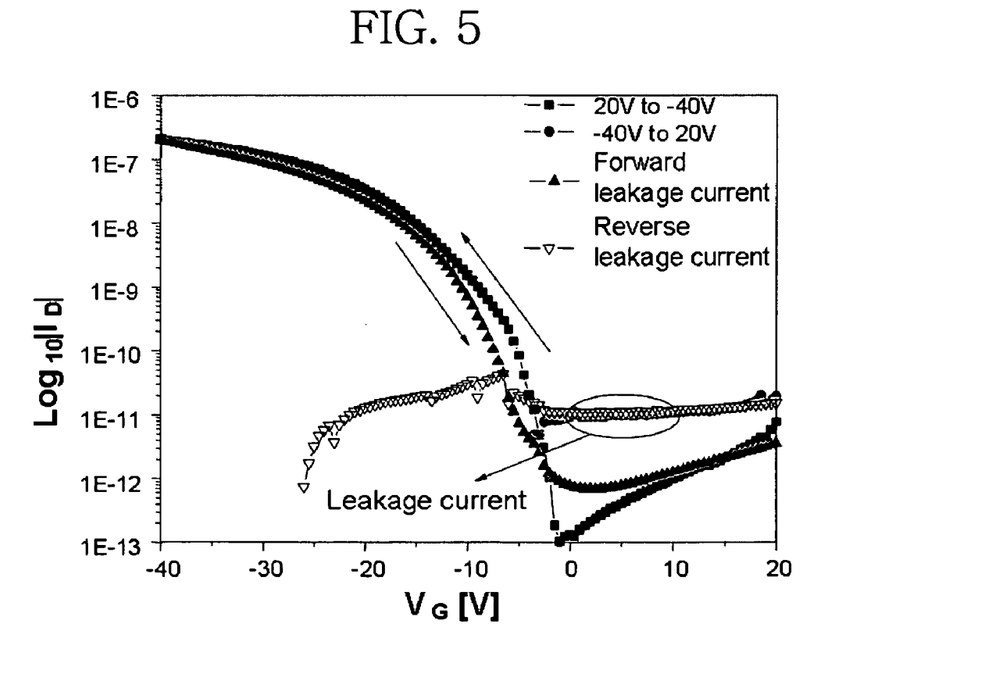
FIG. 5 is a graph illustrating the current transfer characteristics of organic thin film transistors comprising an organic insulating film formed by a method and utilizing a composition according to example embodiments.

As illustrated in FIG. 5, example embodiments of the organic thin film transistors which comprise an example embodiment of an organic insulating film formed by a method according to example embodiments as detailed above, exhibited a decrease in the hysteresis of the organic insulating film while still maintaining acceptably low levels of off-state leakage current.

Although example embodiments have been described herein with reference to the foregoing embodiments, these embodiments do not serve to limit the scope of example embodiments. Accordingly, those skilled in the art to which example embodiments pertains will appreciate that various modifications are possible, without departing from the technical spirit of example embodiments.

As apparent from the foregoing, according to an organic thin film transistor comprising an organic insulating film formed by the method of example embodiments, the use of a water-soluble polymer for the formation of the organic insulating film prevents changes, e.g., deterioration, in the properties of the device. In addition, because the inclusion of one or more water-soluble fluorine compound(s) can be used to obtain acceptable surface properties in the finished layer or pattern, example embodiments of methods can be used to both form organic thin film structures that do not require additional surface treatments to obtain the desired combination of properties. By eliminating the need for subsequent surface treatment of the organic insulating film, example embodiments of the methods of fabrication allow for a shortened and/or simplified fabrication process while still producing organic films and structures, for example, banks, that exhibit acceptable and/or improved current transfer characteristics as reflected in, for example, the hysteresis curves that can be obtained using example embodiments of the aqueous composition(s), methods of forming layers and/or patterns from such compositions for incorporation in a variety of devices including, for example, display drivers and display devices.

What is claimed is:

1. A composition for forming an organic insulating film comprising:
    water;
    at least one UV curing agent;
    at least one copolymer including at least one water-soluble polymer and at least one water-insoluble polymer. wherein the at least one water-soluble polymer is 10 to 99% by weight of the at least one copolymer; and
    at least one water-soluble fluorine compound, and
    wherein each of the at least one UV curing agent is selected from a group consisting of ammonium dichromate, pentaerythritol triacrylate, urethane acrylate and mixtures thereof.

2. The composition for forming an organic insulating film according to claim 1, wherein:
    the water-soluble fluorine compound(s) are present in the composition relative to the UV curing agent(s) and the water-soluble polymer(s) in a dry mass ratio of 1:10 to 1:1.

3. The composition for forming an organic insulating film according to claim 1, wherein:
    the UV curing agent(s) are present in the composition relative to the water-soluble polymer(s) in a dry mass ratio 1:100 to 1:20.

4. The composition for forming an organic insulating film according to claim 1, wherein:
    each of the at least one water-soluble fluorine compound is selected from a group consisting of fluoroalkanes and their derivatives, perfluoroalkylalcohol ethylene oxides and their derivatives, perfluoroalkylcarboxylic acids and their salts, perfluoroalkylsulfonic acids and their salts, perfluoroalkyloxybenzenesulfonic acids and their salts, perfluoroalkylbenzenesulfonic acids and their salts, perfluoroalkyl amine and their salts, perfluoroalkylsulfonamides and their salts, ammonium fluoride, monoethanolamine fluoride, tetramethylammonium fluoride, mixtures and combinations thereof.

5. The composition for forming an organic insulating film according to claim 1, wherein:
    each of the at least one water-soluble polymer is selected from the group consisting of polyvinyl alcohol, polyvinyl chloride, polyacryl amide, polyethylene glycol, polyethylene oxide, polymethyl vinyl ether, polyethylene imine, polyphenylene vinylene, polyaniline, polypyrrole, mixtures, combinations and copolymers thereof.

6. A method for forming an organic insulating pattern, the method comprising the steps of:
    applying the composition according to claim 1 to a substrate to form an organic layer;
    irradiating portions of the organic layer with UV light to form an exposed organic layer; and
    developing the exposed organic layer using an aqueous developer to obtain the organic insulating pattern.

7. The method for forming an organic insulating pattern according to claim 6, wherein:
    applying the composition to the substrate utilizes at least one method selected from a group consisting of spin coating, dip coating, printing, ink jet printing and roll coating.

8. The method for forming an organic insulating pattern according to claim 6, wherein:
   irradiating portions of the organic layer with UV light includes exposing the organic layer to UV irradiation sufficient to promote a degree of cross-linking within the irradiated portions of the organic layer to render the irradiated portions insoluble in aqueous solutions, thereby forming the exposed organic layer.

9. The method for forming an organic insulating pattern according to claim 6, wherein:
   developing the exposed organic layer includes treating the exposed organic layer with room temperature deionized water for a development period of 1 to 5 minutes.

10. The method for forming an organic insulating pattern according to claim 6, further comprising:
    drying the organic layer before irradiating the organic layer; and
    baking the organic insulating pattern.

11. The method for forming an organic insulating pattern according to claim 10, wherein:
    the baking is performed at a bake temperature of 50 to 200° C. for a bake period of 0.5 to 2 hours.

12. A method of fabricating an organic thin film transistor comprising:
    forming a gate electrode;
    applying a composition according to claim 1 to form an organic layer;
    irradiating portions of the organic layer with UV light to form an exposed organic layer;
    developing the exposed organic layer using an aqueous developer to obtain a organic insulating pattern;
    forming source/drain electrodes; and
    forming an organic semiconductor layer.

13. The method of fabricating an organic thin film transistor according to claim 12, wherein:
    the organic semiconductor layer includes at least one material selected from a group consisting of polythiophene, polyaniline, polyacetylene, polypyrrole, polyphenylene vinylene, and mixtures and derivatives thereof.

14. The method of fabricating an organic thin film transistor according to claim 12, wherein:
    each of the gate electrode, source electrode and drain electrode include materials selected from a group consisting of gold (Au), silver (Ag), aluminum (Al), nickel (Ni), molybdenum (Mo), tungsten (W), indium-tin oxide (ITO), indium-zinc oxide (IZO), polythiophene, polyaniline, polyacetylene, polypyrrole, polyphenylene vinylene, mixtures of polyethylenedioxythiophene (PEDOT)/polystyrenesulfonate (PSS), alloys, combinations and mixtures thereof.

15. The method of fabricating an organic thin film transistor according to claim 12, wherein:
    the organic thin film transistor is fabricated on a substrate that includes a material selected from a group consisting of glass, silicon, plastic and combinations thereof.

16. The method of fabricating an organic thin film transistor according to claim 12, further comprising:
    forming bank structures on portions of the source/drain electrodes.

17. The method of fabricating an organic thin film transistor according to claim 16, wherein:
    forming the bank structures includes applying an aqueous solution of at least one water-soluble polymer, at least one UV curing agent and at least one water-soluble fluorine to form a bank coating layer;
    exposing the bank coating layer to UV irradiation to form an exposed bank coating layer; and
    developing the exposed bank coating layer with an aqueous developer to form the bank structures.

18. The method of fabricating an organic thin film transistor according to claim 12, wherein:
    the organic thin film transistor exhibits a configuration that may be classified as a bottom contact type configuration, a top contact type configuration or a top gate type configuration.

* * * * *